United States Patent
Yamaguchi et al.

(10) Patent No.: US 10,414,352 B2
(45) Date of Patent: Sep. 17, 2019

(54) WIRE HARNESS INCLUDING SHIELD MEMBER SURROUNDING ELECTRIC WIRES

(71) Applicant: Yazaki Corporation, Tokyo (JP)

(72) Inventors: Yasuhiro Yamaguchi, Kakegawa (JP); Hayato Iizuka, Kakegawa (JP); Takeshi Innan, Kakegawa (JP); Hiroshi Aihara, Toyota (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/047,606

(22) Filed: Jul. 27, 2018

(65) Prior Publication Data

US 2019/0039539 A1 Feb. 7, 2019

(30) Foreign Application Priority Data

Aug. 4, 2017 (JP) .................. 2017-151480

(51) Int. Cl.
*H02G 3/04* (2006.01)
*B60R 16/02* (2006.01)
*H05K 9/00* (2006.01)

(52) U.S. Cl.
CPC ....... *B60R 16/0215* (2013.01); *H02G 3/0468* (2013.01); *H05K 9/0098* (2013.01)

(58) Field of Classification Search
USPC ........................................................ 174/36
See application file for complete search history.

(56) References Cited

U.S. PATENT DOCUMENTS

| 1,953,893 | A | * | 4/1934 | Chase | H01B 9/0611 |
| | | | | | 174/103 |
| 2,960,561 | A | * | 11/1960 | Plummer | A44B 19/16 |
| | | | | | 138/128 |
| 4,398,058 | A | * | 8/1983 | Gerth | H01B 7/202 |
| | | | | | 174/106 D |
| 6,262,375 | B1 | * | 7/2001 | Engelhardt | H01B 12/02 |
| | | | | | 174/125.1 |
| 7,939,761 | B2 | * | 5/2011 | Baverel | B29C 49/0021 |
| | | | | | 174/93 |

(Continued)

FOREIGN PATENT DOCUMENTS

| JP | 2012134367 A | * | 7/2012 |
| JP | 2015-198042 A | | 11/2015 |
| JP | 2017-4861 A | | 1/2017 |

OTHER PUBLICATIONS

Communication dated Aug. 1, 2019 from the State Intellectual Property Office of the P.R.C. in counterpart application No. 201810877917.8.

*Primary Examiner* — William H. Mayo, III
*Assistant Examiner* — Krystal Robinson
(74) *Attorney, Agent, or Firm* — Sughrue Mion, PLLC

(57) ABSTRACT

A wire harness includes: a wire part including a plurality of electric wires gathered in a same direction; and a shield member which collectively surrounds an outer periphery of the wire part. The shield member is disposed to be interposed between adjacent electric wires of the plurality of electric wires in the wire part. The adjacent electric wires in the wire part are arranged at a predetermined interval such that a predetermined value of electrostatic capacitance is established between the electric wires.

5 Claims, 5 Drawing Sheets

(56) References Cited

U.S. PATENT DOCUMENTS

| | | | |
|---|---|---|---|
| 2001/0040042 A1* | 11/2001 | Stipes | H01B 11/1016 174/113 R |
| 2006/0237219 A1* | 10/2006 | Glew | H01B 7/0892 174/113 C |
| 2009/0096126 A1 | 4/2009 | Baverel et al. | |
| 2011/0155458 A1* | 6/2011 | Kato | B60R 16/0215 174/74 R |
| 2015/0289423 A1 | 10/2015 | Imahori et al. | |
| 2016/0362073 A1* | 12/2016 | Yamaguchi | B60R 16/0207 |
| 2016/0365166 A1* | 12/2016 | Ohkubo | H02G 3/0481 |
| 2016/0366795 A1* | 12/2016 | Ohkubo | H01B 7/0045 |

* cited by examiner

WIRE HARNESS INCLUDING SHIELD MEMBER SURROUNDING ELECTRIC WIRES

CROSS-REFERENCES TO RELATED APPLICATIONS

This application is based on and claims priority from Japanese Patent Application No. 2017-151480 filed on Aug. 4, 2017, the entire contents of which are incorporated herein by reference.

FIELD

One or more embodiments of the present invention relate to a wire harness including a wire part including a plurality of electric wires gathered in the same direction and a shield member which collectively surrounds the outer periphery of the wire part.

BACKGROUND

Wire harnesses are typically used for electrically connecting devices mounted on vehicles such as hybrid vehicles and electric vehicles. A particular wire harness, for example, used to electrically connect an inverter unit and a motor unit is also called a motor cable. A technique disclosed in JP-A-2017-4861 is known as a technique regarding such a wire harness, for example.

A wire harness illustrated in FIG. 5 of JP-A-2017-4861 includes a wire part, a braided wire, and a corrugated tube. The wire part includes three electric wires which connect an inverter unit and a motor unit and supply power from the inverter unit to the motor unit. The electric wires are collectively arranged in the same direction. The braided wire is formed to collectively surround the outer circumference of the wire part. The corrugated tube is formed to accommodate the wire part surrounded by the braided wire.

SUMMARY

However, the related art involves a steep voltage increase in the power output from the inverter unit before it is supplied to the motor unit. Such a steep rising voltage repeatedly reflects between the inverter unit and the motor unit due to impedance mismatch. This may cause an excessive surge voltage to be applied to the motor unit.

In order to solve the above problem, it is conceivable to match impedance between the inverter unit, the wire harness (motor cable), and the motor unit to suppress the reflection. In that case, since the impedance of the wire harness is smaller than that of the motor unit, it is necessary to increase the impedance of the wire harness. In order to increase the impedance of the wire harness, the electrostatic capacitance of the wire harness needs to be reduced.

However, in the related art, the short distance between the adjacent electric wires in the wire part causes the electrostatic capacitance between the respective electric wires to be large, which tends to generate noise in each electric wire. In addition, since the distance between the respective electric wires is small, each of the adjacent electric wires is easily affected by the noise generated between other adjacent electric wires. Therefore, when noise is generated in each wire, the radiation noise of the wire part tends to increase, and as a result, there is a problem that an excessive surge voltage may be generated in some cases.

One or more embodiments of the present invention have been made in consideration of the circumstances described above, and an object thereof is to provide a wire harness capable of suitably suppressing a surge voltage.

In a first aspect of the present invention, there is provided a wire harness including: a wire part including a plurality of electric wires gathered in a same direction; and a shield member which collectively surrounds an outer periphery of the wire part, wherein the shield member is disposed to be interposed between adjacent electric wires of the plurality of electric wires in the wire part, and wherein the adjacent electric wires in the wire part are arranged at a predetermined interval such that a predetermined value of electrostatic capacitance is established between the electric wires.

According to the first aspect of the present invention, since the shield member is disposed to be interposed between the adjacent electric wires, it is possible to arrange the electric wires at a predetermined interval such that a predetermined value of electrostatic capacitance is established between the electric wires. As a result, the electrostatic capacitance between the electric wires can be adjusted to a desired electrostatic capacitance, and the impedance of the wire harness can be increased. By increasing the impedance of the wire harness, impedance matching of the whole circuit can be achieved, and the reflection of voltages can be suppressed.

Further, with the shield member disposed to be interposed between the adjacent electric wires, the electrostatic capacitance can be shut off between the adjacent electric wires. This enables to reduce the electrostatic capacitance between the electric wires more efficiently and to adjust the electrostatic capacitance to a desired electrostatic capacitance.

Further, the shield member may be adapted to be inserted into and removed from between the adjacent electric wires, so that it is possible to adjust the reduction amount of the electrostatic capacitance between the electric wires by inserting and removing the shield member into and from between the adjacent electric wires according to a surge voltage occurring in the relevant circuit.

In a second aspect of the present invention, there is provided the wire harness according to the first aspect, wherein the shield member is disposed between the adjacent electric wires in the wire part so as to enter a position of a central axis of the wire part.

According to the second aspect, since the shield member is disposed to be interposed between the adjacent electric wires so as to enter the position of the central axis of the wire part, the shield member can surround substantially the entire circumference of the electric wires. That enables to shut off the electrostatic capacitance more reliably between the adjacent electric wires, thereby reducing the electrostatic capacitance between the electric wires more effectively, and it is possible to adjust the capacitance to a desired electrostatic capacitance.

In a third aspect of the present invention, there is provided the wire harness according to the first or second aspect, further including: a plurality of exterior members disposed on an outer periphery of the shield member, wherein each of the exterior members is formed into a tubular shape, and has a cutout portion extending in a longitudinal direction of the exterior member from one longitudinal end of the exterior member to the other longitudinal end, and wherein the exterior members are disposed to press the shield member from outside.

According to the third aspect, the exterior members are disposed to press the shield member from outside, and thereby the shield member can be maintained to be interposed between the adjacent electric wires. As a result, since the shield member does not come out from between the adjacent electric wires, the electric wires can be maintained in a state of being arranged at a predetermined interval such that a predetermined value of electrostatic capacitance is established between the electric wires. In addition, since the shield member does not come out from between the adjacent electric wires, it is possible to shut off the electrostatic capacitance between the electric wires more favorably.

In a fourth aspect of the present invention, there is provided the wire harness according to the first, second, or third aspect, wherein the exterior member is configured such that both circumferential ends of the exterior member enter between the adjacent electric wires in the wire part to hold the shield member between the electric wires.

According to the fourth aspect, both circumferential ends of the exterior member enter between the adjacent electric wires to hold the shield member disposed to be interposed between the electric wires. As a result, since the shield member is more reliably prevented from coming out from between the adjacent electric wires, the electric wires are maintained in a state of being arranged at a predetermined interval to have a predetermined value of electrostatic capacitance between the electric wires.

Further, both the circumferential ends of the exterior member entered between the adjacent electric wires are interposed between the adjacent electric wires, and thus it is possible to increase the distance between the electric wires of the adjacent electric wires by the thickness of the exterior member. This enables to more efficiently reduce the electrostatic capacitance between the electric wires, and to adjust the electrostatic capacitance to a desired electrostatic capacitance.

According to one or more embodiments of the present invention, the electrostatic capacitance between the electric wires can be adjusted to a desired electrostatic capacitance, and the impedance of the wire harness is increased, so that matching of the impedance in the whole circuit can be achieved to suppress the reflection of voltage, whereby a surge voltage can be suitably suppressed.

BRIEF DESCRIPTION OF DRAWINGS

FIGS. 1A and 1B are views illustrating a wire harness according to one embodiment of the present invention, in which FIG. 1A is a schematic view illustrating a routing state of the wire harness and FIG. 1B is a perspective view of the wire harness;

DETAILED DESCRIPTION

Hereinafter, a wire harness according to one embodiment of the present invention will be described with reference to FIGS. 1A and 1B and 2.

Figure 1A:
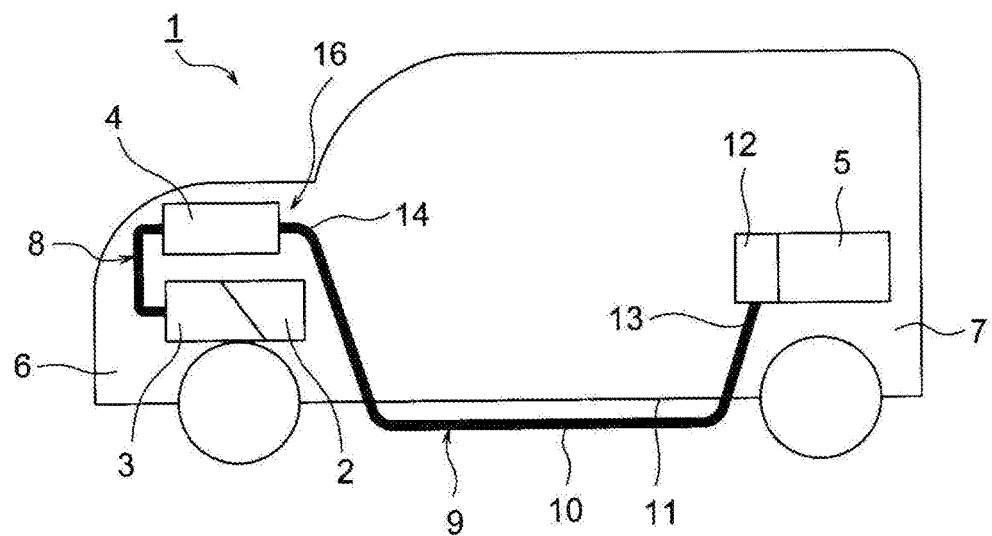
Figure 1B:
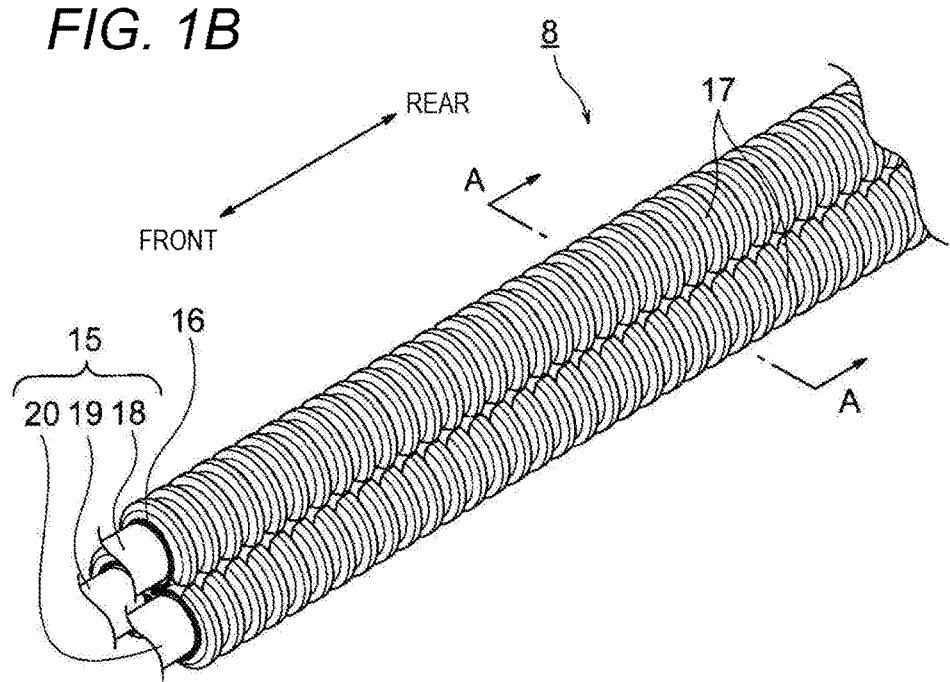
Figure 2:
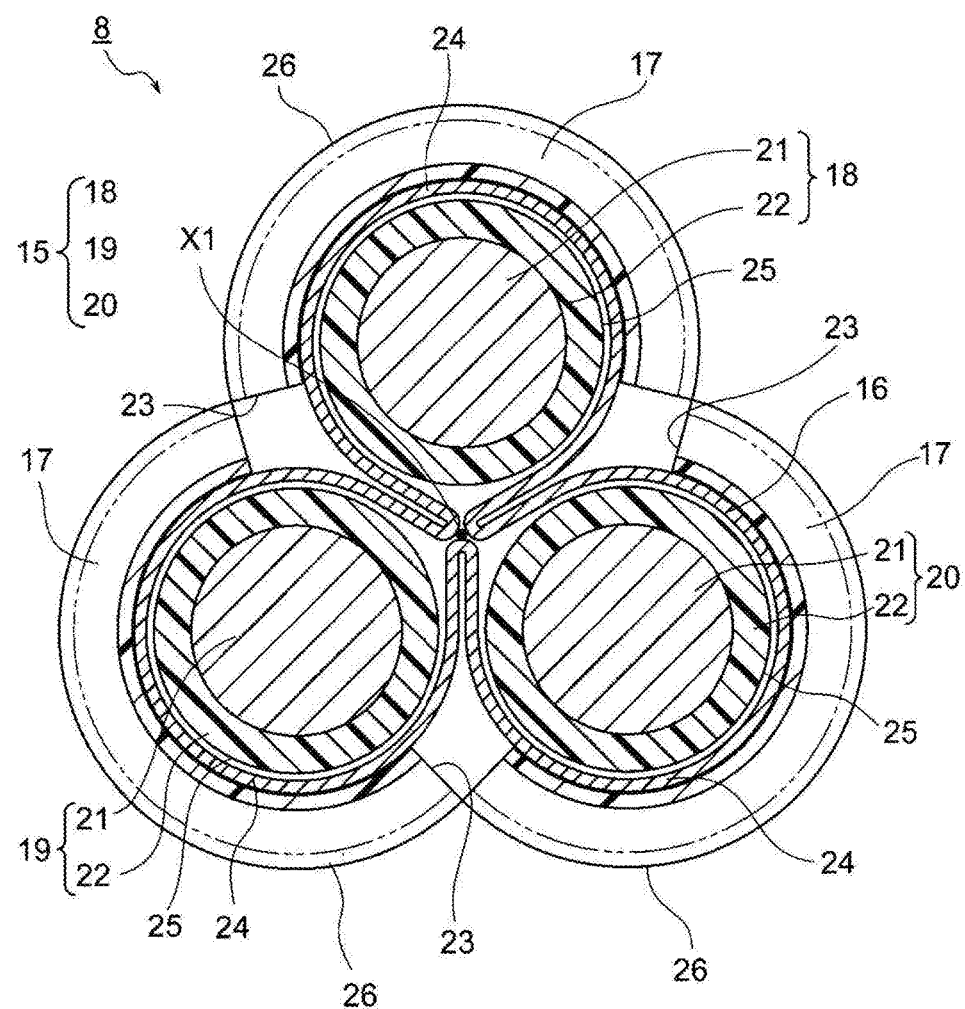
FIG. 2 is a cross-sectional view of the wire harness taken along line A-A illustrated in FIG. 1B.

FIGS. 1A and 1B are views illustrating a wire harness according to the embodiment of the invention, wherein FIG. 1A is a schematic view illustrating a routing state of the wire harness and FIG. 1B is a perspective view of the wire harness, and FIG. 2 is a cross-sectional view of the wire harness taken along line A-A illustrated in FIG. 1B. The bidirectional arrow in FIG. 1B indicates a forward and backward direction (each arrow direction is merely illustrative).

The present embodiment is illustrated for a wire harness wired in a hybrid car, but may be applied to an electric or partially electric general vehicle.

In FIG. 1A, reference numeral 1 indicates a hybrid vehicle. The hybrid vehicle 1 is driven by two kinds of motive power of an engine 2 and a motor unit 3 combined. Electric power is supplied to the motor unit 3 via an inverter unit 4 from a battery (battery pack) 5. The engine 2, the motor unit 3, and the inverter unit 4 are mounted in an engine room 6 where front wheels and the relevant parts are installed in this embodiment. Further, the battery 5 is mounted on a rear portion 7 of the vehicle where rear wheels and the relevant parts are installed (the battery 5 may be mounted in a vehicle interior behind the engine room 6).

The motor unit 3 and the inverter unit 4 are connected to each other by a high-voltage wire harness 8 according to the embodiment. The wire harness 8 is what is called a motor cable. The battery 5 and the inverter unit 4 are also connected by a high-voltage wire harness 9. The wire harness 9 has an intermediate portion 10 arranged in a vehicle floor 11. The wire harness 9 is routed roughly in parallel with the vehicle under the vehicle floor. The vehicle floor 11, which is known in the related art of vehicle body and is a so-called panel member, has through holes (not illustrated) formed at prescribed positions. The through hole allows the wire harness 9 to pass.

The wire harness 9 and the battery 5 are connected to each other via a junction block 12 provided on the battery 5. To the junction block 12, a rear end 13 of the wire harness 9 is electrically connected in a known manner. A front end 14 of the wire harness 9 is electrically connected to the inverter unit 4 by a known method.

It is to be noted that the present embodiment is also applicable to the wire harness 9.

The following description will elaborate the present embodiment. Here, it is assumed that the motor unit 3 includes a motor and a generator. In addition, the inverter unit 4 includes an inverter and a converter. The motor unit 3 is assumed to be formed as a motor assembly including a shield case. The inverter unit 4 is also formed as an inverter assembly including its shield case. The battery 5 is of Ni-MH type or Li-ion type, and is made into a module. It is also contemplated to use a power storage device such as a capacitor, for example. The battery 5 is not particularly limited as long as it can be used for the hybrid vehicle 1 and an electric vehicle.

As illustrated in FIG. 1B, the wire harness 8 according to the embodiment connecting the motor unit 3 and the inverter unit 4 as in FIG. 1A, includes a wire part 15, a shield member 16, and an exterior member 17. The configuration of each component of the wire harness 8 will be described below.

The wire part 15 will be described first. As illustrated in FIG. 1B, the wire part 15 is formed by three electric wires 18 to 20 gathered in the same direction (forward and backward direction in FIG. 1B). As illustrated in the cross-sectional view of FIG. 2, the thus formed wire part 15 has the three electric wires 18 to 20 arranged like stacked bales of hay when viewed in the direction of the central axis X1 of the wire part 15. In the present embodiment, the electric wires 18 to 20 are well-known high voltage electric wires, and they each includes a conductor 21 and an insulating sheath 22 covering the conductor 21.

The electric wires 18 to 20 adjacent to each other in the wire part 15 illustrated in FIG. 2 have clearances for a shield member 16 described below to enter when it is inserted (between the electric wire 18 and the electric wire 19, between the electric wire 18 and the electric wire 20, and between the electric wire 19 and the electric wire 20).

With the shield member 16 interposed as described below between the respective electric wires 18 to 20 illustrated in FIG. 2, the electric wires 18 to 20 are arranged at a predetermined interval, such that a predetermined value of electrostatic capacitance is established between the electric wires.

The number of electric wires constituting the wire part 15 is not limited to three as above. The number of electric wires may be two, for example (see second and third modified examples described below).

The following describes the shield member 16. As illustrated in FIG. 2, the shield member 16 is provided for electromagnetic shielding (as a countermeasure against electromagnetic waves) formed to collectively surround the outer periphery of the wire part 15. In the present embodiment, the shield member 16 employs a braid formed by knitting a plurality of strands in a tubular shape. The shield member 16 is formed to have substantially the same length as the entire length of the wire part 15. The shield member 16 is formed to have an inner diameter larger than the outer periphery of the wire part 15. Specifically, the shield member 16 is formed to be somewhat loose with respect to the wire part 15.

The shield member 16 is adapted to collectively surround the outer periphery of the wire part 15, wherein substantially U-bent sections are formed in the shield member 16 to be interposed respectively between the electric wires 18 to 20, adjacent to the wire part 15, as illustrated in FIG. 2.

The substantially U-bent sections of the shield member 16, interposed between the electric wires 18 to 20, have a spring back bias such that the adjacent electric wires 18 to 20 maintain a predetermined interval therebetween. The 'predetermined interval' is so determined that the electrostatic capacitance between the adjacent electric wires 18 to 20 can be reduced to a desired electrostatic capacitance value. Being configured and structured to shield the electric wires of the adjacent electric wires 18 to 20, the shield member 16 interposed between the electric wires 18 to 20 is adapted to block the electrostatic capacitance between the adjacent electric wires 18 to 20.

As illustrated in FIG. 2, the shield member 16, which is interposed between the adjacent electric wires 18 to 20, has tips leading to a position of the central axis X1 of the wire part 15. When entered into the position of the center axis X1 of the wire part 15, the shield member 16 is arranged to surround substantially the entire circumference of the electric wires 18 to 20, as illustrated in FIG. 2. That is, the shield member 16 shields substantially the entire circumference of the electric wires 18 to 20.

It is assumed that the shield member 16 is capable of being inserted into and removed from between the adjacent electric wires 18 to 20. Depending on the surge voltage generated in the relevant circuit, such a shield member 16 may adjust the reduction amount of the electrostatic capacitance between the electric wires by having the shield member 16 inserted into or removed from between the electric wires 18 to 20.

The shield member 16 has a longitudinal end connected to a shield case or the like of the motor unit 3 via a motor unit's connection portion (not illustrated). The other longitudinal end of the shield member 16 is connected to a shield case or the like of the inverter unit 4 via an inverter unit's connection portion (not illustrated).

The shield member 16 is not limited to a braid as long as it provides a countermeasure against electromagnetic waves. The shield member 16 may instead employ, for example, a conductive metal foil, a member including the metal foil, a fabric having conductivity, or the like.

The exterior member 17 will be elaborated next. The exterior member 17 illustrated in FIGS. 1B and 2 is formed of a resin material having insulating properties, and is arranged on the outer periphery of the wire part 15 that is surrounded by the shield member 16. Plural exterior members 17 are provided by the same number (three in the present embodiment) as the number of the electric wires constituting the wire part 15. The exterior member 17 is formed into a tubular shape and is formed in a shape having at least one cutout portion 23. The cutout portion 23 is formed to extend from one longitudinal end to the other longitudinal end of the exterior member 17 longitudinally of the exterior member 17. Such an exterior member 17 is formed to have a substantially C shape when viewed in the direction of the central axis X1 of the wire part 15 as in the cross-sectional view of FIG. 2.

In this embodiment, a corrugated tube is employed as the exterior member 17. As illustrated in FIG. 1B, such an exterior member 17 is formed in a bellows tube shape. The exterior member 17 is formed to have substantially the same length as the entire length of the wire part 15 (electric wires 18 to 20). The exterior member 17 is formed to be bendable at a desired angle when packaging and shipping the wire harness 8, and when routing the wire harness 8 with a vehicle. That is, the exterior member 17 can be deflected to have a bent shape, and can be naturally returned to a straight original state as illustrated in FIG. 1B.

As illustrated in FIG. 2, when the exterior members 17 are disposed on the outer periphery of the wire part 15 as surrounded by the shield member 16, the exterior members 17 press the shield member 16 interposed between inner surfaces 24 of the exterior members 17 and outer surfaces of the insulating sheaths 22 of the electric wires 18 to 20 from outside.

The exterior members 17 are fixed to each other when disposed on the outer circumference of the wire part 15 surrounded by the shield member 16. Although not specifically illustrated, the exterior members 17 are fixed by a known tape winding.

A manufacturing process (work) of the wire harness 8 will be described based on the aforementioned configuration and structure.

In a first step, the wire part 15 (electric wires 18 to 20), the shield member 16, and the exterior member 17 are manufactured in advance in a predetermined length, and then the wire part 15 is collectively surrounded by the shield member 16.

In a second step, the shield member 16 is led to enter between the adjacent electric wires 18 to 20. By using a jig (not illustrated), the shield member 16 is brought into a substantially U shape between the adjacent electric wires 18 to 20 as illustrated in FIG. 2.

Here, the shield member 16, which has entered between the adjacent electric wires 18 to 20, makes its leading end portions advance to the position of the center axis X1 of the wire part 15.

In a third step, the exterior members 17 are disposed on the outer periphery of the wire part 15 surrounded by the shield member 16 (see FIG. 2). Here, the exterior members 17 are disposed to press, by the inner surfaces 24 thereof, the shield member 16 interposed between the inner surfaces 24 of the exterior members 17 and the outer surfaces 25 of the insulating sheaths 22 of the electric wires 18 to 20 from outside.

In a fourth step, a tape is wound around the outer surfaces 26 of the exterior members 17 to fix the exterior members 17 to each other, although not specifically illustrated.

This completes the manufacturing work of the wire harness 8, to provide the finished wire harness 8. Detailed description of the process at the both longitudinal end portions of the wire harness 8 is omitted.

In the wire harness 8 thus provided, with the shield member 16 arranged to be interposed between the adjacent electric wires 18 to 20, the electric wires 18 to 20 can be arranged at a predetermined interval such that a predetermined value of the electrostatic capacitance between the electric wires is established. This enables to adjust the electrostatic capacitance between the electric wires 18 to 20 to a desired electrostatic capacitance, and to increase the impedance of the wire harness 8. Increasing the impedance of the wire harness 8 allows to match the impedance of the entire circuit (the motor unit 3, the wire harness 8 and the inverter unit 4) and to suppress the reflection of voltage surges.

Further, in the wire harness 8, with the shield member 16 arranged to be interposed between the adjacent electric wires 18 to 20, the electrostatic capacitance between the electric wires can be cut off between the adjacent electric wires 18 to 20. This enables to reduce the electrostatic capacitance between the electric wires more efficiently between the wires 18 to 20, and to adjust the electrostatic capacitance to a desired value.

Further, in the wire harness 8, the shield member 16 is adapted to be inserted into and removed from between the adjacent electric wires 18 to 20, and thereby the shield member 16 can be pushed in or pulled from between the adjacent electric wires 18 to 20 according to a voltage surge occurring in the circuit, to adjust the reduction amount of the electrostatic capacitance between the electric wires.

Additionally, in the wire harness 8, the shield member 16 is arranged between the adjacent electric wires 18 to 20, extending up to the position of the central axis X1 of the wire part 15, and thereby the entire circumference of the respective electric wires 18 to 20 can become generally surrounded by the shield member 16. As a result, the electrostatic capacitance between the adjacent electric wires 18 to 20 can be cut off more reliably, to reduce the electrostatic capacitance between the electric wires more efficiently and to adjust the electrostatic capacitance to a desired value.

Furthermore, with the wire harness 8, the exterior members 17 are arranged to press the shield member 16 from the outside, and thereby the shield member 16 maintains to be interposed between the adjacent electric wires 18 to 20. As a result, the shield member 16 does not come out from between the adjacent electric wires 18 to 20, and thereby the electric wires 18 to 20 maintain a state in which they are arranged at a predetermined interval such that a predetermined value of the electrostatic capacitance is established between the electric wires 18 to 20. In addition, the secure placement of the shield member 16 between the adjacent electric wires 18 to 20 helps to better block the electrostatic capacitance between the electric wires 18 to 20.

Figure 3:
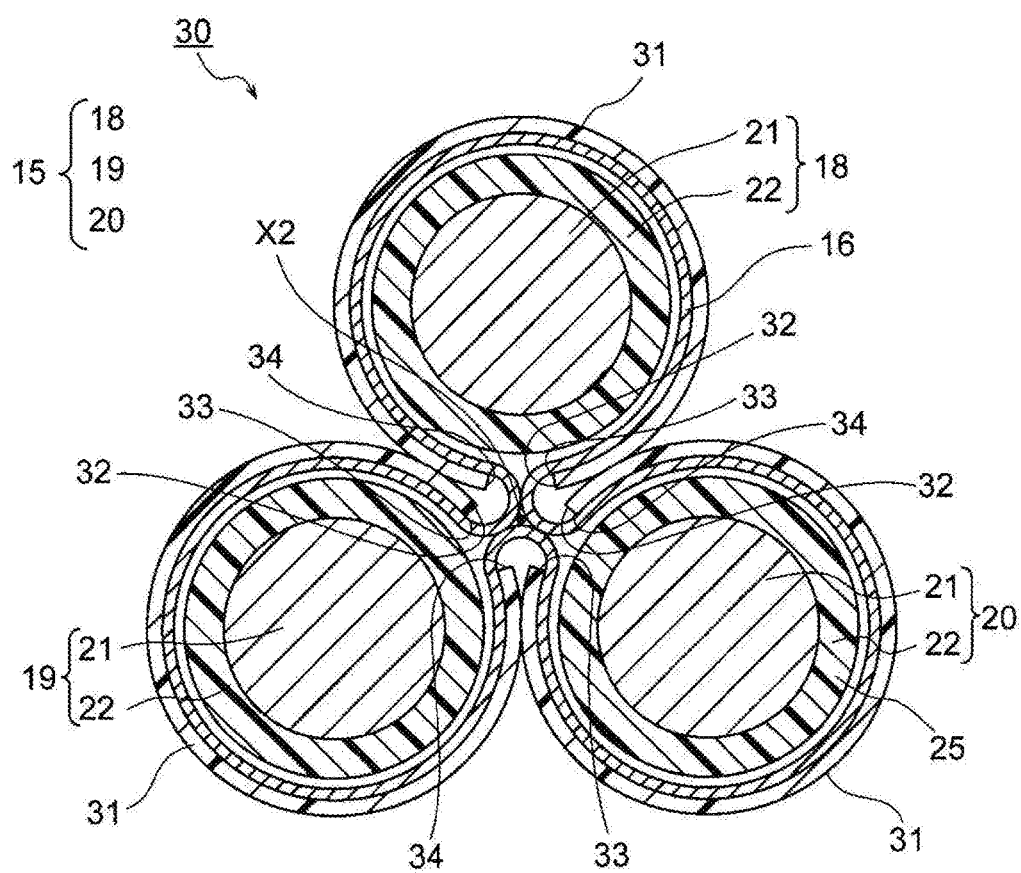
FIG. 3 is a cross-sectional view illustrating a first modified example of a wire harness.
Figure 4:
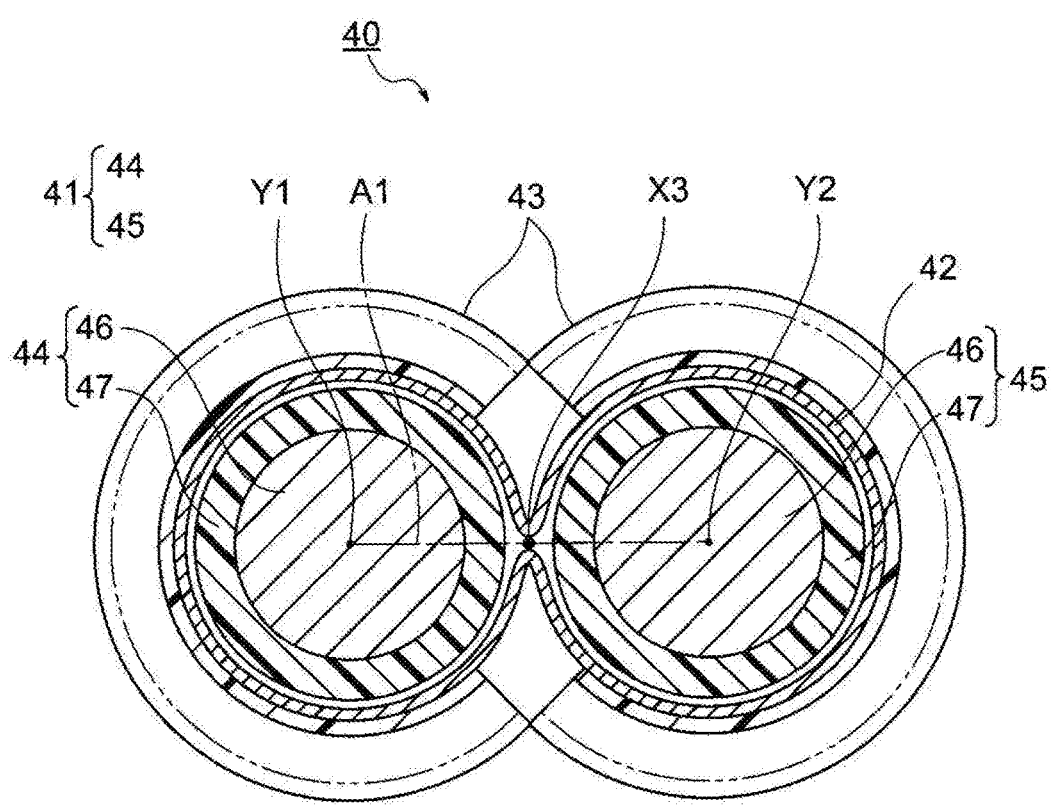
FIG. 4 is a cross-sectional view illustrating a second modified example of a wire harness.
Figure 5:
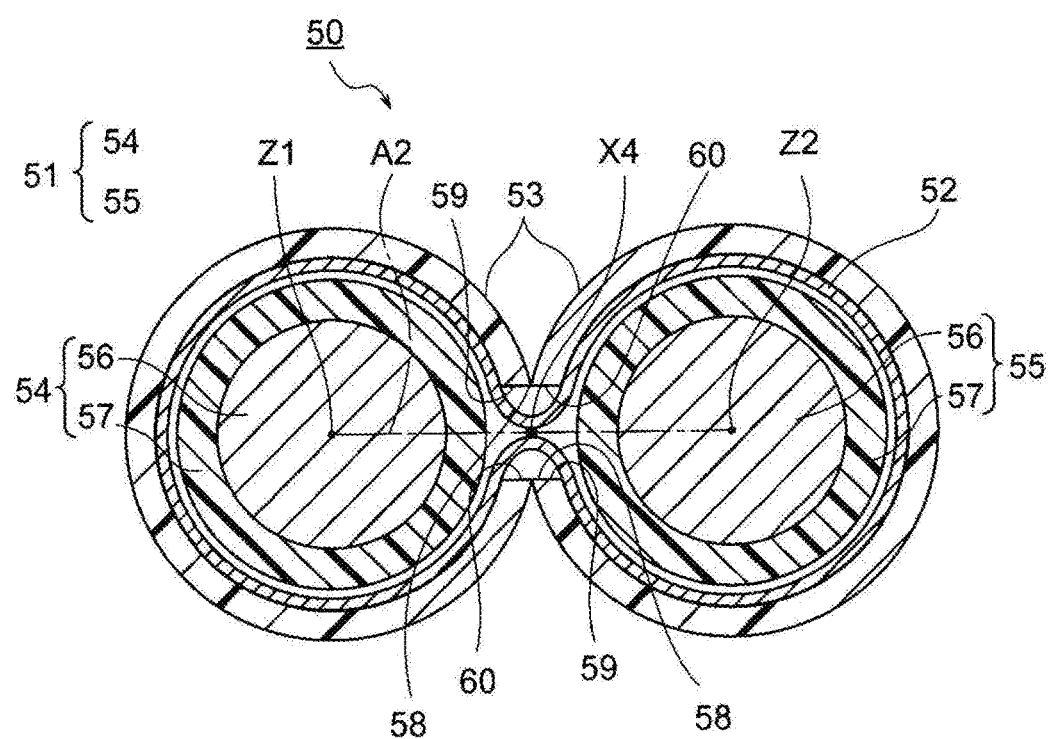
FIG. 5 is a cross-sectional view illustrating a third modified example of a wire harness.

The above-described wire harness 8 may be replaced with a first modified example illustrated in FIG. 3, a second modified example illustrated in FIG. 4, or a third modified example illustrated in FIG. 5. Hereinafter, first to third modified examples of the wire harness will be described with reference to FIGS. 3 to 5.

FIG. 3 is a cross-sectional view illustrating the first modified example of a wire harness, FIG. 4 is a sectional view of the second modified example of a wire harness, and FIG. 5 is a cross-sectional view of the third modified example of a wire harness.

The first modified example will be described. A wire harness 30 illustrated in FIG. 3 differs from the above-described embodiment in that it includes exterior members 31. The exterior member 31 has cutout portions 32. The cutout portion 32 is formed such that the circumferential width of the exterior member 31 is smaller than that resulting from the cutout portion 23 (see FIG. 2) of the exterior member 17 in the present embodiment.

As illustrated in FIG. 3, the exterior member 31 has one circumferential end 33 and the other circumferential end 34 that are formed to enter between the adjacent electric wires 18 to 20, and to hold the shield member 16 between the electric wires as it is so arranged to be interposed therebetween. The one circumferential end 33 and the other circumferential end 34 of the exterior member 16 serve as an example of "both circumferential ends of the exterior member" in the claims.

The wire harness 30 of the first modified example as described above exhibits, in addition to the same effect as that of the present embodiment, further effects as follows. The one circumferential end 33 and the other circumferential end 34 of the exterior member 31 enter between the adjacent electric wires 18 to 20, and they hold the shield member 16 between the electric wires as it is supposed to be interposed therebetween. As a result, the shield member 16 is more reliably prevented from coming out from between the adjacent electric wires 18 to 20, so that the electric wires 18 to 20 are kept arranged at a predetermined interval to have a predetermined value of electrostatic capacitance between the electric wires.

Further, according to the wire harness 30 of the first modified example, once entered in between the adjacent electric wires 18 to 20, the one circumferential end 33 and the other circumferential end 34 of the exterior member 31 are interposed between the adjacent electric wires 18 to 20, which allows to increase the distance between the electric wires of the adjacent electric wires 18 to 20 by the thickness of the exterior member 31. This enables to more efficiently reduce the electrostatic capacitance between the electric wires, and to adjust the electrostatic capacitance to a desired electrostatic capacitance.

The second modified example will be described. A wire harness 40 illustrated in FIG. 4 differs from the present embodiment in that it includes a wire part 41. The wire part 41 is formed by gathering two electric wires 44 and 45 in the same direction. Each of the electric wires 44 and 45 includes a conductor 46 and an insulating sheath 47 covering the conductor 46.

As illustrated in FIG. 4, the wire part 41 has a central axis X3 located at a point bisecting a line segment A1 connecting a central axis Y1 of the conductor 46 of the electric wire 44 with a central axis Y2 of the conductor 46 of the electric wire 45. A shield member 42 is arranged to enter the position of the central axis X3 of the wire part 41 between the electric wires 44 and 45.

Such a wire harness 40 exhibits the same effect as the present embodiment.

The following describes the third modified example. A wire harness 50 illustrated in FIG. 5 is a modified example of the present embodiment in that it includes a wire part 51 and exterior members 53.

The wire part 51 is formed by bundling two electric wires 54 and 55 in the same direction. Each of the electric wires 54 and 55 includes a conductor 56 and an insulating sheath 57 covering the conductor 56.

As illustrated in FIG. 5, a central axis X4 of the wire part 51 is a point that bisects a line segment A2 connecting a central axis Z1 of the conductor 56 of the electric wire 54 with a central axis Z2 of the conductor 56 of the electric wire 55. A shield member 52 is arranged to enter the position of the central axis X4 of the wire part 51 between the electric wires 54 and 55.

The exterior members 53 have cutout portions 58. The cutout portion 58 is formed such that the circumferential width of the exterior member 53 is smaller than that resulting from the cutout portion 23 (see FIG. 2) of the exterior member 17 in the present embodiment.

As illustrated in FIG. 5, each of the exterior members 53 has one circumferential end 59 and the other circumferential end 60 both entering between the electric wires 54 and 55. The exterior members 53 hold the shield member 52 between the electric wires 54 and 55 as it is supposed to be interposed therebetween.

Such a wire harness 50 exhibits the same effect as the present embodiment and the first modification.

The wire harnesses 8, 30, 40, and 50 have the following effects. As described above with reference to FIGS. 1 to 5, according to the wire harnesses 8, 30, 40, and 50, the electrostatic capacitance between the electric wires is adjusted to a desired value of electrostatic capacitance, to increase the impedances of the wire harness 8, 30, 40, and 50. This allows to match the impedance of the entire circuit and to suppress the reflection of voltage surges, resulting in the voltage surges advantageously suppressed.

It is a matter of course that various modified examples may be made without departing from the technical idea and scope of the invention.

The invention claimed is:

1. A wire harness comprising:

a wire part comprising a plurality of electric wires gathered in a same direction; and a shield member which collectively surrounds an outer periphery of the wire part, wherein the shield member is disposed to be interposed between adjacent electric wires of the plurality of electric wires in the wire part, and wherein the adjacent electric wires in the wire part are arranged at a predetermined interval such that a predetermined value of electrostatic capacitance is established between the electric wires, wherein the shield member comprises a curved portion interposed between the adjacent electric wires such that a portion of an outer surface of the shield member directly faces another portion of the outer surface of the shield member.

2. The wire harness according to claim 1, wherein the shield member is disposed between the adjacent electric wires in the wire part so as to enter a position of a central axis of the wire part.

3. The wire harness according to claim 1, further comprising:

a plurality of exterior members disposed on an outer periphery of the shield member, wherein each of the exterior members is formed into a tubular shape, and has a cutout portion extending in a longitudinal direction of the exterior member from one longitudinal end of the exterior member to the other longitudinal end, and wherein the exterior members are disposed to press the shield member from outside.

4. The wire harness according to claim 1, wherein the shield member is capable of being inserted into and removed from the adjacent electric wires in the wire part.

5. A wire harness comprising:

a wire part comprising a plurality of electric wires gathered in a same direction;

a shield member which collectively surrounds an outer periphery of the wire part, and a plurality of exterior members disposed on an outer periphery of the shield member, wherein the shield member is disposed to be interposed between adjacent electric wires of the plurality of electric wires in the wire part, wherein the adjacent electric wires in the wire part are arranged at a predetermined interval such that a predetermined value of electrostatic capacitance is established between the electric wires, and wherein each of the exterior members is configured such that both circumferential ends of each of the exterior members enter between the adjacent electric wires in the wire part to hold the shield member between the electric wires.

* * * * *